United States Patent
Jurasek et al.

(10) Patent No.: US 9,036,408 B1
(45) Date of Patent: May 19, 2015

(54) PHASE CHANGE MEMORY WITH BIT LINE MATCHING

(71) Applicant: Being Advanced Memory Corporation, Essex Junction, VT (US)

(72) Inventors: Ryan Jurasek, Burlington, VT (US); Aaron Willey, Burlington, VT (US)

( * ) Notice: Subject to any disclaimer, the term of this patent is extended or adjusted under 35 U.S.C. 154(b) by 135 days.

(21) Appl. No.: 14/011,327

(22) Filed: Aug. 27, 2013

Related U.S. Application Data

(60) Provisional application No. 61/694,220, filed on Aug. 28, 2012.

(51) Int. Cl.
*G11C 11/00* (2006.01)
*G11C 13/00* (2006.01)

(52) U.S. Cl.
CPC .......... *G11C 13/004* (2013.01); *G11C 13/0004* (2013.01)

(58) Field of Classification Search
CPC .......... G11C 13/0004; G11C 13/0069; G11C 11/5678
USPC .......... 365/163, 206, 207
See application file for complete search history.

(56) References Cited

U.S. PATENT DOCUMENTS 6,996,010 B2 * 2/2006 Briner .................. 365/185.21

FOREIGN PATENT DOCUMENTS

| CN | 102270505 A | 12/2011 |
|---|---|---|
| CN | 102332302 A | 1/2012 |
| CN | 102594315 A | 7/2012 |
| CN | 102637453 A | 8/2012 |
| CN | 103165179 A | 6/2013 |
| CN | 103165181 A | 6/2013 |

* cited by examiner

*Primary Examiner* — Son Dinh

(57) ABSTRACT

Methods, circuits, and systems for phase change memories. A matching bit line, on which no data-containing PCM cells have been selected, is used to cancel out time-dependent current components due to parasitic capacitive and leakage resistance loading of bit lines. This can effectively allow direct comparison of the current from the phase change memory cell to the desired reference current, at a time before the voltage of the first bit line permits stable operations using DC comparison.

20 Claims, 19 Drawing Sheets

PHASE CHANGE MEMORY WITH BIT LINE MATCHING

CROSS-REFERENCE

Priority is claimed from 61/694,220 filed Aug. 28, 2012, which is hereby incorporated by reference.

The following four applications, including the present application, share a common assignee, all have a common effective filing date, and share at least some overlapping inventorship. All of these applications, and all of their direct and indirect parent applications, are hereby incorporated by reference: U.S. application Ser. No. 14/011,327 filed herewith; U.S. application Ser. No. 14/011,306 filed herewith; U.S. application Ser. No. 14/011,423 filed herewith; and U.S. application Ser. No. 14/011,266 filed herewith. Applicant reserves the right to claim priority back to all of these, in the US and/or in any other country where such priority can legally be claimed.

BACKGROUND

The present application relates to phase change memories, and more particularly to phase change memories having large capacitive loads.

Note that the points discussed below may reflect the hindsight gained from the disclosed inventions, and are not necessarily admitted to be prior art.

Phase change memory ("PCM") is a relatively new nonvolatile memory technology, which is very different from any other kind of nonvolatile memory. First, the fundamental principles of operation, at the smallest scale, are different: no other kind of solid-state memory uses a reversible PHYSICAL change to store data. Second, in order to achieve that permanent physical change, an array of PCM cells has to allow read, set, and reset operations which are all very different from each other. The electrical requirements of the read, set, and reset operations make the peripheral circuit operations of a PCM very different from those of other nonvolatile memories. Obviously some functions, such address decoding and bus interface, can be the same; but the closest-in parts of the periphery, which perform set, reset, and read operations on an array or subarray, must satisfy some unique requirements.

The physical state of a PCM cell's memory material is detected as resistance. For each selected cell, its bit line is set to a known voltage, and the cell's access transistor is turned on (by the appropriate word line). If the cell is in its low-resistance state, it will sink a significant current from the bit line; if it is not, it will not.

Set and Reset operations are more complicated. Both involve heat. As discussed below, a "set" operation induces the memory material to recrystallize into its low-resistance (polycrystalline) state; a "reset" operation anneals the memory material into its high-resistance (amorphous) state.

Write operations (Set and Reset) normally have more time budget than read operations. In read mode a commercial PCM memory should be competitive with the access speed (and latency if possible) of a standard DRAM. If this degree of read speed can be achieved, PCM becomes very attractive for many applications.

The phase change material is typically a chalcogenide glass, using amorphous and crystalline (or polycrystalline) phase states to represent bit states.

A complete PCM cell can include, for example: a top electrode (connected to the bit line), a phase change material (e.g. a chalcogenide glass), a conductive pillar which reaches down from the bottom of the phase change material, an access transistor (gated by a word line), and a bottom connection to ground. The phase change material can extend over multiple cells (or over the whole array), but the access transistors are laterally isolated from each other by a dielectric.

FIG. 2A shows an example of a PCM element 2010. A top electrode 2020 overlies a phase change material 2030, e.g. a chalcogenide glass. Note that material 2030 also includes a mushroom-shaped annealed zone (portion) 2070 within it. (The annealed zone 2070 may or may not be present, depending on what data has been stored in this particular location.) The annealed zone 2070, if present, has a much higher resistivity than the other (crystalline or polycrystalline) parts of the material 2030.

A conductive pillar 2050 connects the material 2030 to a bottom electrode 2040. In this example, no selection device is shown; in practice, an access transistor would normally be connected in series with the phase change material. The pillar 2050 is embedded in an insulator layer 2060.

When voltage is applied between the top 2020 and bottom 2040 electrodes, the voltage drop will appear across the high-resistivity zone 2070 (if present). If sufficient voltage is applied, breakdown will occur across the high-resistivity zone. In this state the material will become very conductive, with large populations of mobile carriers. The material will therefore pass current, and current crowding can occur near the top of the pillar 2050. The voltage which initiates this conduction is referred to as the "snapback" voltage, and FIG. 2C shows why.

FIG. 2C shows an example of instantaneous I-V curves for a device like that of FIG. 2A, in two different states. Three zones of operation are marked.

In the zone 2200 marked "READ," the device will act either as a resistor or as an open (perhaps with some leakage). A small applied voltage will result in a state-dependent difference in current, which can be detected.

However, the curve with open circles, corresponding to the amorphous state of the device, shows some more complex behaviors. The two curves show behaviors under conditions of higher voltage and higher current.

If the voltage reaches the threshold voltage $V_{th}$, current increases dramatically without any increase in voltage. (This occurs when breakdown occurs, so the phase-change material suddenly has a large population of mobile carriers.) Further increases in applied voltage above $V_{th}$ result in further increases in current; note that this upper branch of the curve with hollow circles shows a lower resistance than the curve with solid squares.

If the applied voltage is stepped up to reach the zone 2150, the behavior of the cell is now independent of its previous state.

When relatively large currents are applied, localized heating will occur at the top of the pillar 2050, due to the relatively high current density. Current densities with typical dimensions can be in the range of tens of millions of Amperes per square cm. This is enough to produce significant localized heating within the phase-change material.

This localized heating is used to change the state of the phase-change material, as shown in FIG. 2B. If maximum current is applied in a very brief pulse 2100 and then abruptly stopped, the material will tend to quench into an amorphous high-resistivity condition; if the phase-change material is cooled more gradually and/or not heated as high as zone 2150, the material can recrystallize into a low-resistivity condition. Conversion to the high-resistance state is normally referred to as "Reset", and conversion to the low-resistance state is normally referred to as "Set" (operation 2080). Note that, in this example, the Set pulse has a tail where current is reduced fairly gradually, but the Reset pulse does not. The duration of the Set pulse is also much longer than that of the Reset pulse, e.g. tens of microseconds versus hundreds of nanoseconds.

FIG. 2D shows an example of temperature versus resistivity for various PCM materials. It can be seen that each curve has a notable resistivity drop 2210 at some particular temperature. These resistivity drops correspond to phase change to a crystalline (or polysilicon) state. If the material is cooled gradually, it remains in the low resistivity state after cooling.

In a single-bit PCM, as described above, only two phases are distinguished: either the cell does or does not have a significant high-resistivity "mushroom cap" 2070. However, it is also possible to distinguish between different states of the mushroom cap 2070, and thereby store more than one bit per cell.

FIG. 2E shows an equivalent circuit for an "upside down" PCM cell 2010. In this example the pass transistor 2240 is gated by Word line 2230, and is connected between the phase-change material 2250 and the bit line 2220. (Instead, it is somewhat preferable to connect this transistor between ground and the phase-change material.

FIG. 2F shows another example of a PCM cell 2010. A bit line 2220 is connected to the top electrode 2020 of the phase-change material 2250, and transistor 2240 which is connected to the bottom electrode 2030 of the PCM element. (The word line 2230 which gates the vertical transistor 2240 is not shown in this drawing.) Lines 2232, which are shown as separate (and would be in a diode array), may instead be a continuous sheet, and provide the ground connection.

FIG. 2G shows an example of how resistance (R) changes over long time periods (t) for a single PCM cell following a single PCM write event at time t=0. The resistance curve 2400 for a cell which has been reset (i.e. which is in its high-resistance state) may rise at first, but then drifts significantly lower. The resistance curve 2410 for a cell in the Set state is much flatter. The sense margin 2420, i.e., the difference between set and reset resistances, also decreases over time. Larger sense margins generally result in more reliable reads, and a sense margin which is too small may not permit reliable reading at all. 2G represents the approximate behavior of one known PCM material; other PCM material compositions may behave differently. For example, other PCM material compositions may display variation of the set resistance over time.

The downwards drift of reset resistance may be due to, for example, shrinking size of the amorphous zone of the phase-change material, due to crystal growth; and, in some cells, spontaneous nucleation steepening the drift curve (possibly only slightly) due to introducing further conductive elements into the mushroom-shaped programmable region.

FIG. 2H shows an example of a processing system 2300. Typically, a processing system 2300 will incorporate at least some of interconnected power supplies 2310, processor units 2320 performing processing functions, memory units 2330 supplying stored data and instructions, and I/O units 2340 controlling communications internally and with external devices 2350.

FIG. 2I shows an example of a PCM single ended sensing memory. Two different PCM cells 2400 on different ends of a sense amplifier can be selected separately. Selected elements 2410 are separately sensed by a single-ended sense amplifier 2420.

FIG. 2J shows an example of a known PCM single ended sense amplifier 2500. Generally, in a single ended sense amplifier, a cell read output conducted by a selected bit line BLB is compared against a reference current to provide a digital output OUT. When the PRECHARGE signal turns on transistor 2530, voltage V04 (e.g., 400 mV) precharges the bit line BLB. After precharge ends, the READ signal turns on transistor 2550. Transistor 2550 is connected, through source follower 2560 and load 2580, to provide a voltage which comparator 2600 compares to Voltage_REF, to thereby generate the digital output OUT.

A variety of nonvolatile memory technologies have been proposed over recent decades, and many of them have required some engineering to provide reference values for sensing. However, the requirements and constraints of phase-change memory are fundamentally different from those of any other kind of nonvolatile memory. Many memory technologies (such as EEPROM, EPROM, MNOS, and flash) test the threshold voltage of the transistor in a selected cell, so referencing must allow for the transistor's behavior. By contrast, phase-change memory simply senses the resistance of the selected cell. This avoids the complexities of providing a reference which will distinguish two (or more) possibilities for an active device's state, but does require detecting a resistance value, and tracking external variations (e.g. temperature and supply voltage) which may affect the instantaneous value of that resistance.

The possibility of storing more than one bit of data in a single phase-change material has also been suggested. Phase-change memories implementing such architectures are referred to here as "multi-bit" PCMs. If the "Set" and/or "Reset" operations can be controlled to produce multiple electrically distinguishable states, then more than one bit of information can be stored in each phase-change material location. It is known that the current over time profile of the Set operation can be controlled to produce electrically distinguishable results, though this can be due to more than one effect. In the simplest implementation, shorter anneals—too short to produce full annealing of the amorphous layer—can be used to produce one or more intermediate states. In some materials, different crystalline phases can also be produced by appropriate selection of the current over time profile. However, what is important for the present application is merely that electrically distinguishable states can be produced.

For example, if the complete layer of phase-change material can have four possible I/V characteristics, two bits of information can be stored in each cell—IF the read cycle can accurately distinguish among the four different states.

(The I/V characteristics of the cells which are not in the fully Set state are typically nonlinear, so it is more accurate to distinguish the states in terms of current flow at a given voltage; resistance is often used as a shorthand term, but implies a linearity which may not be present. The cells can be highly nonlinear, and usually operate similarly to a punch-through diode.)

In order to make use of the possible multi-bit cell structures, it is necessary to reliably distinguish among the possible states. To make this distinction reliably, there must be some margin of safety, despite the change in characteristics which may occur due to history, manufacturing tolerances, and environmental factors. Thus the read architecture of multi-bit PCMs is a far more difficult challenge it is for PCMs with single-bit cells.

SUMMARY

The present inventors have realized that phase change memory operation can be improved by matching time-dependent behaviors of a "dummy" bit line with a data bit line to permit earlier sensing. This can advantageously be used to in effect cancel out at least some time-dependent component of a bit line signal being sensed. This time-dependent component can be, at least in part, RC inrush current which is dependent on capacitive loading of the bit line. This cancellation can effectively permit direct comparison of the PCM current to the desired reference current without having to wait for time-dependent currents to reach steady state. This can be particularly advantageous due to the highly nonlinear nature of phase change memory.

The disclosed innovations, in various embodiments, provide one or more of at least the following advantages. However, not all of these advantages result from every one of the innovations disclosed, and this list of advantages does not limit the various claimed inventions.

Earlier sensing;
Increased sensing speed;
Direct comparison of PCM current to reference current;
Statistical removal of a noise component;
Reduced setup time;
Reduced access time; and/or
Increased accuracy (especially for highly nonlinear high-resistance PCM states).

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

Figure 1A:
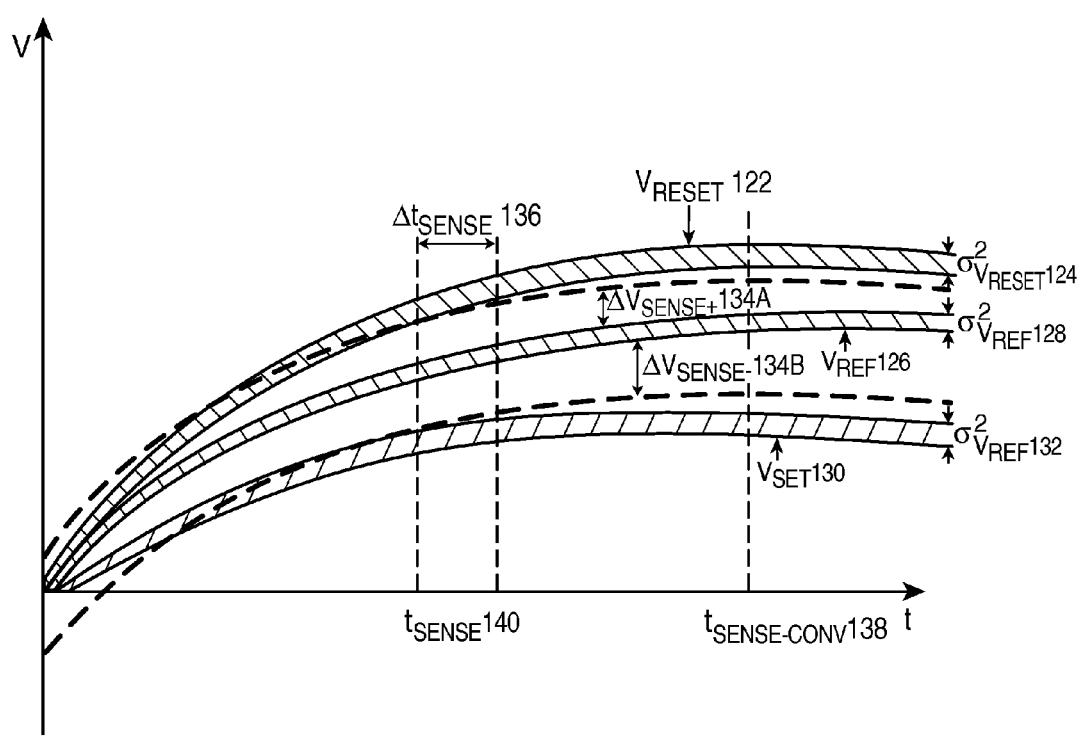
FIG. 1A shows a plot of voltage vs. time for one sample embodiment of the present inventions.

The numerous innovative teachings of the present application will be described with particular reference to presently preferred embodiments (by way of example, and not of limitation). The present application describes several inventions, and none of the statements below should be taken as limiting the claims generally.

The present inventors have realized that phase change memory operation can be improved by matching time-dependent behaviors of a "dummy" bit line with a data bit line to permit earlier sensing. This can advantageously be used to in effect cancel out at least some time-dependent component of a bit line signal being sensed. This time-dependent component can be, at least in part, RC inrush current which is dependent on capacitive loading of the bit line. This cancellation can effectively permit direct comparison of the PCM current to the desired reference current without having to wait for time-dependent currents to reach steady state. This can be particularly advantageous due to the highly nonlinear nature of phase change memory.

In phase change memories, the state of a phase change element is sensed by applying a voltage across the selected cell. The current sinked from the bit line by the selected cell is monitored, and used to determine the electrical, and thus physical, state of the selected cell. Many phase change memory cells are typically placed in parallel on a bit line, for increased access density. A word line is connected so that, when driven active, cells on every column of the word line can be accessed in parallel through that column's bit line. However, large numbers of these cells in parallel lead to large capacitive loads.

The present inventors have realized that as a bit line is charged, the current it draws typically comprises current from the selected phase change memory element, time-dependent current from the capacitive loading of the bit line, and leakage current. In order for the current due only to the PCM element to be sensed accurately and reliably, the bit line current must generally first reach steady state, to provide at least a sensing margin of difference. While the time elapsed to steady state will generally depend on the charging scheme, the wait time required for steady state can add a nontrivial amount of time to overall operation.

The present inventions teach, inter alia, that when an element on a bit line is to be selected for reading, a reference bit line is preferably charged substantially identically and simultaneously with the selected bit line. The time-dependent RC current resulting from the parasitic capacitance of the selected bit line can preferably be matched against the time-dependent RC current resulting from the parasitic capacitance of the reference bit line. The substantially-identical and substantially-simultaneous charging can, for example, use current mirroring. By matching the source impedance of the charging circuit, this can preferably ensure that the currents on both the target bit line and the reference bit line have substantially identical time-dependent RC current components. If the time-dependent RC current components are substantially identical, then it can be unnecessary to wait until the target bit line current reaches steady state. If the bit lines are at substantially equivalent points on their respective RC time curves, then the bit lines can be matched at a much earlier time than conventionally feasible. It can be unnecessary to wait for steady state or attempt to compensate dynamically for time-dependent current components (such as RC current).

At least some of the statistical parasitic DC leakage current can also be effectively cancelled. This parasitic leakage current is substantially time-independent, at least on the time scales preferably under consideration, but can be, for example, dependent on temperature. Cancellation of at least some leakage current permits a better signal-to-noise ratio, which is essential for multi-bit operation. Multi-bit operation dictates that a smaller signal must be sensed, and signal distribution and noise become a greater concern. Cancelling both the time-dependent (e.g. RC) and DC parasitic (e.g.

leakage) current components caused by the selection of a long bit line can increase the reliability, speed, and performance of multi-bit operation.

The time elapsed for reliable sensing, using the innovative methods of the present application, can depend, at least in part, on the length of the bit lines. In at least some presently-preferred embodiments, one thousand PCM cells are on each bit line. The associated capacitance of such a bit line can be e.g. 1 pF, and charging such a bit line can require e.g. 30 ns. A sample embodiment having ten thousand PCM cells per bit line can have a capacitance of e.g. 10 pF, and can require e.g. 300 ns to charge. This capacitance can also depend on e.g. the state distribution of cells on the bit line. Direct comparison of sensing times to conventional sensing times can thus be difficult; however, the present innovative techniques can frequently permit reliable sensing within e.g. half the conventional sensing time. This sensing time can also vary with e.g. the strength of the signal being measured.

Since the two bit lines are preferably precharged substantially simultaneously and identically, these two precharge terms will ideally cancel mathematically. Realistically, however, there will generally be at least some mismatch between the capacitances of the two bit lines. Bit line capacitance can vary depending on the state distribution of cells on the bit line. Reliable capacitance matching to a reference bit line will thus essentially never be reliably perfect, absent other measures. This mismatch can negatively affect access time.

This phenomenon of capacitive mismatch will be absent if only one bit line is accessed, as there will be nothing to match (or mismatch) against. As a result, determining precise numerical improvements in access times can be difficult when no mismatch is specified. Mismatch between two source followers (e.g. one attached to a reference bit line and one attached to a selected bit line) can also affect relative access times.

Direct comparison of the present innovative techniques to conventional methods can be difficult, in part because indications of bit line capacitance are often estimates rather than simulations or measurements. In some conventional implementations, it has been assumed that the bit line can be shorted to a power source. This can be accurate in ideal situations, in which the bit line can be shorted to exactly the desired voltage, then unshorted and connected to the source follower. At this point, the cell has been charged to exactly the desired point, and cell current will be visible shortly thereafter. However, this is usually not the case in actual implementations. A mismatch is almost always present between the precharge voltage and the actual threshold voltage of the source follower device. Some percentage of the cells will then have very long access times, as the precharge voltage will not be the best read voltage for the particular cell in question.

Unlike other memory architectures, phase change memory cells are highly nonlinear, particularly in RESET (and RESET-like) states. These cells will therefore have a snapback voltage, which (in one sample embodiment) can occur at e.g. approximately 1 V, though the precise snapback voltage will vary based on the previously-written state of the cell. At least some presently-preferred embodiments designate e.g. 600 mV to be a "safe" upper bound on voltage to avoid snapback, with a target of roughly 400 mV. Below snapback, the cell will generally be in a "read" regime. At snapback, tunneling effects lead to breakdown, and a large current can be driven through the cell. Once the voltage across the cell passes the snapback point, the cell will be in a "write" regime. Sensing can occur at almost any point below snapback, but smaller signals can be more difficult to sense, so it can be preferable to wait until the signal has reached a certain level before sensing. In one presently-preferred sample embodiment, this preferred read voltage can be e.g. roughly 400 mV.

In FIG. 1A, in order for the sense amplifier to reliably compare $V_{RESET}$ 122 and $V_{SET}$ 130 to reference voltage $V_{REF}$ 126, the entire widths $\sigma^2_{VRESET}$ 124 and $\sigma^2_{VSET}$ 132 of $V_{RESET}$ 122 and $V_{SET}$ 130 respectively must be outside the sense margins for at least a sensing time $\Delta t_{SENSE}$ 636. The sense margins $\Delta V_{SENSE+}$ 134A and $\Delta V_{SENSE-}$ 134B are the same in magnitude as in conventional embodiments, but as $V_{REF}$ 126 changes here, so too do the boundaries of the sense margins. In some embodiments, positive sense margin $\Delta V_{SENSE+}$ 134A and negative sense margin $\Delta V_{SENSE-}$ 134B will have different magnitudes. Sensing cannot conventionally occur before $V_{RESET}$ 122 and $V_{SET}$ 130 settle outside the sense margins at $t_{SENSE-CONV}$ 138. Reference voltage $V_{REF}$ 126 includes voltage from a reference bit line, and rises e.g. according to an RC curve.

Each of the voltage curves has some width, which can be e.g. indicated by covariance $\sigma^2$, resulting from e.g. error, uncertainty, and standard deviation. In this example, the width $\sigma^2_{VRESET}$ 124 of curve $V_{RESET}$ 122 is roughly comparable to the width $\sigma^2_{VSET}$ 132 of curve $V_{SET}$ 130, and both curve widths 124 and 132 are larger than the width $\sigma^2_{VREF}$ 128 of reference voltage $V_{REF}$ 126. Instead of being unable to reliably begin sensing until $t_{SENSE-CONV}$ 138, as is conventionally true, sensing can begin at e.g. $t_{SENSE}$ 140, at which point all sensing conditions are met for at least the subsequent time interval $\Delta t_{SENSE}$ 136. To sense, the margins of the three curves must not overlap, the signals must have diverged by a certain amount, and the signals must have reached at least some minimum level. Sensing furthermore cannot begin until the signal-to-noise ratio has stabilized at least somewhat.

The conditions for sensing (in one single-bit sample embodiment) can thus be expressed with the following system of equations, where $\bar{V}$ indicates the mean of V, over the time interval $[t_{SENSE\_CONV}, t_{SENSE\_CONV}+\Delta t_{SENSE}]$:
$((\bar{V}_{RESET}-\frac{1}{2}\sigma^2 V_{RESET}>\bar{V}_{REF}+\Delta V_{SENSE+}),$
$(\bar{V}_{SET}-\frac{1}{2}\sigma^2 _{VSET}<\bar{V}_{REF}-\Delta V_{SENSE-}),(V_{RESET},V_{REF},$
$V_{SET}>V_{READ-MIN}))$.

Figure 1B:
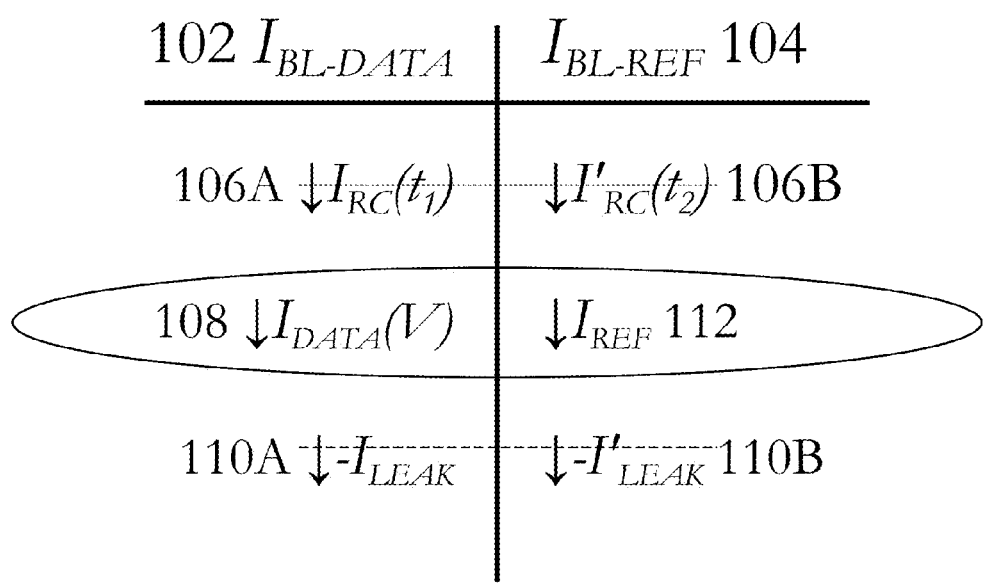
FIG. 1B shows current components for one sample embodiment of the present inventions.
Figure 2A:
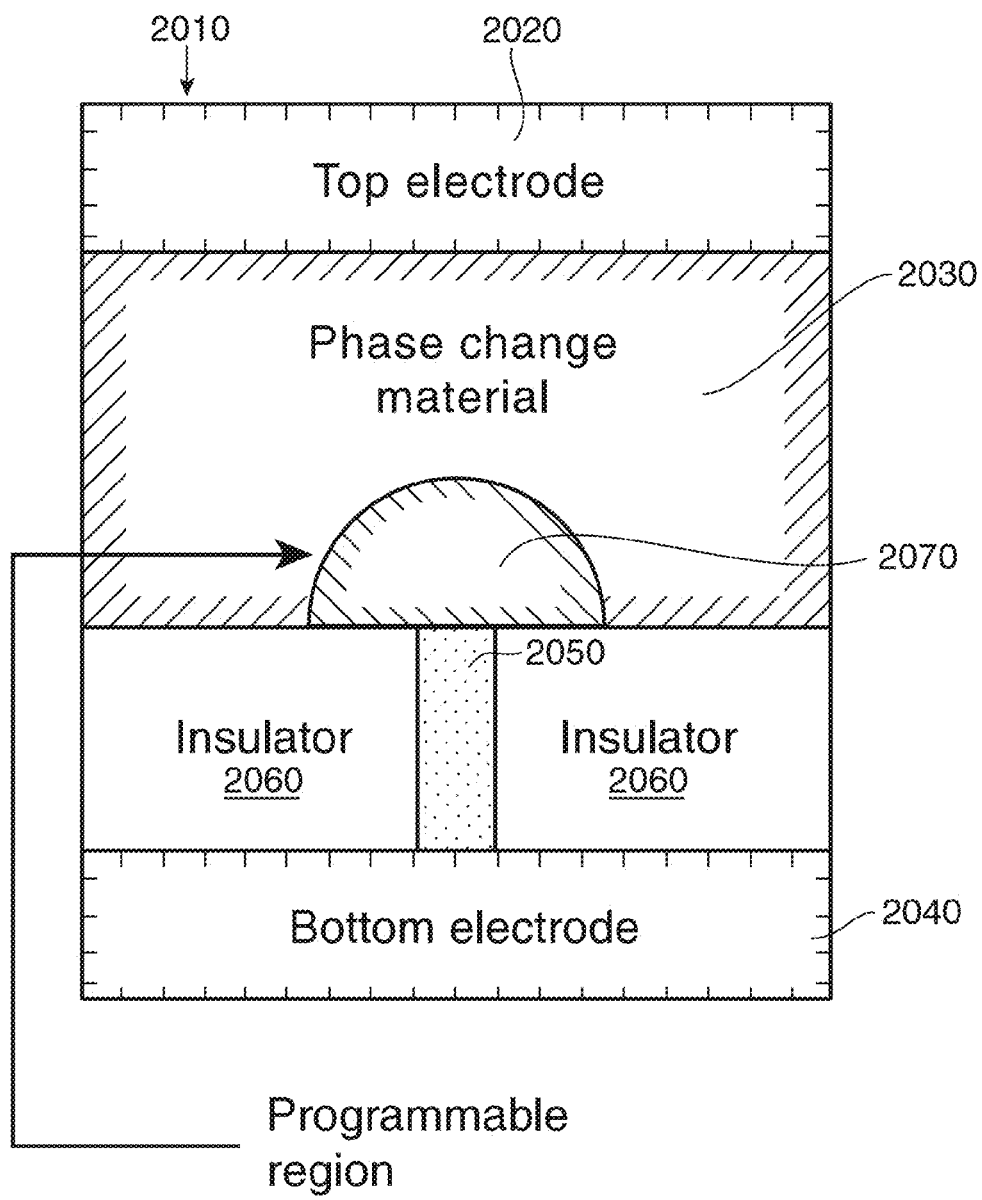
FIG. 2A shows an example of a PCM element.
Figure 2B:
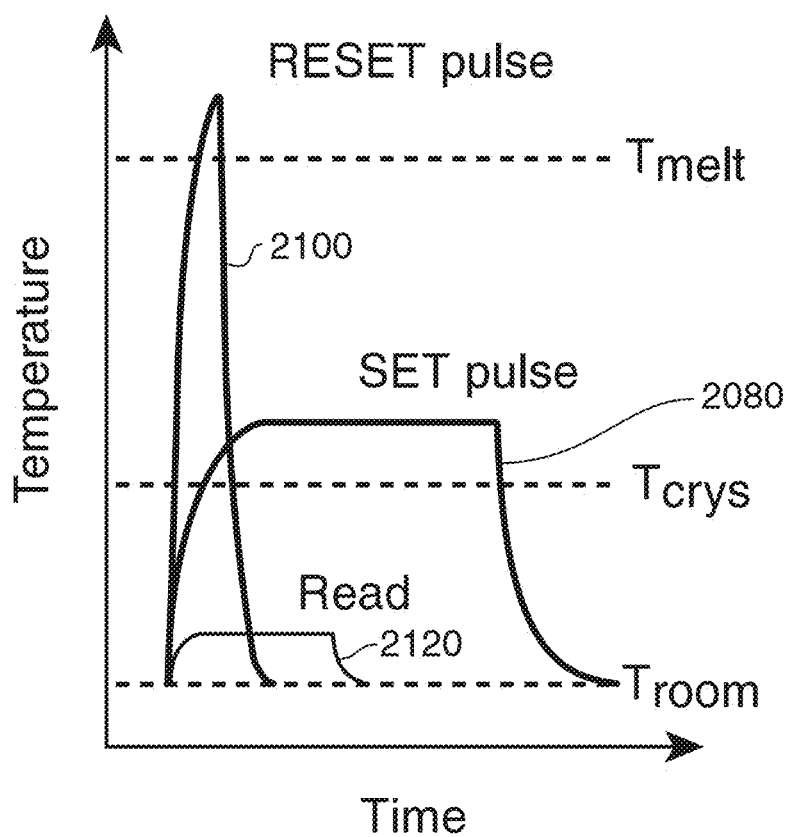
FIG. 2B shows an example of PCM bit line signals.
Figure 2C:
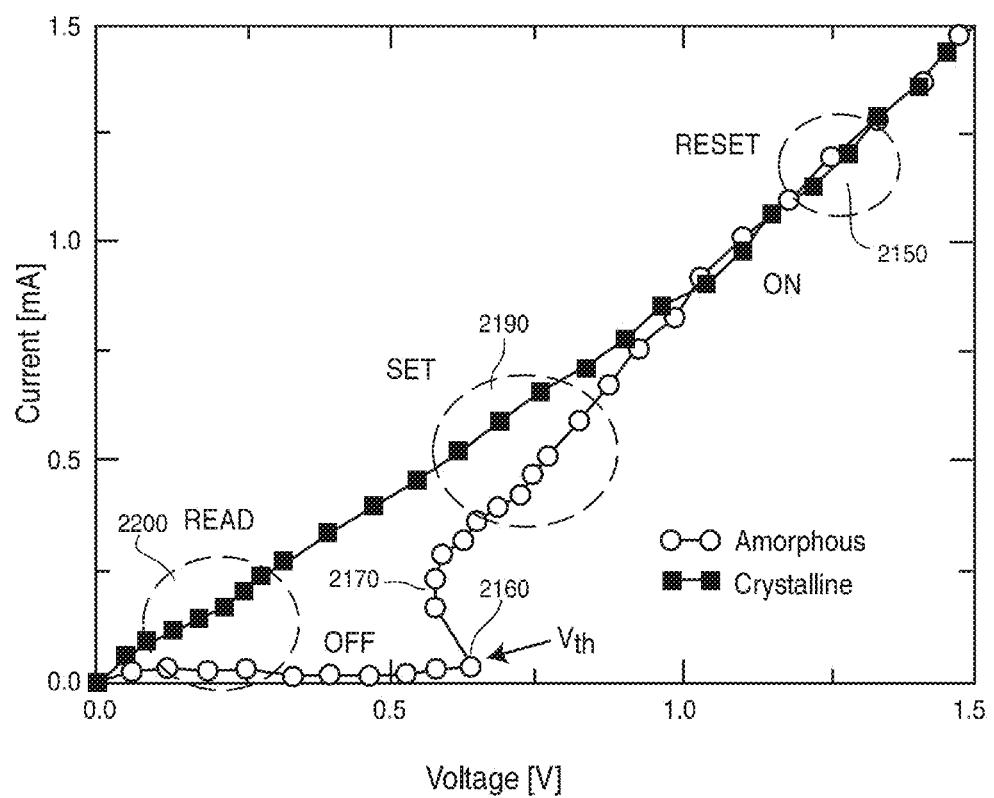
FIG. 2C shows an example of voltage versus current in a PCM material.
Figure 2D:
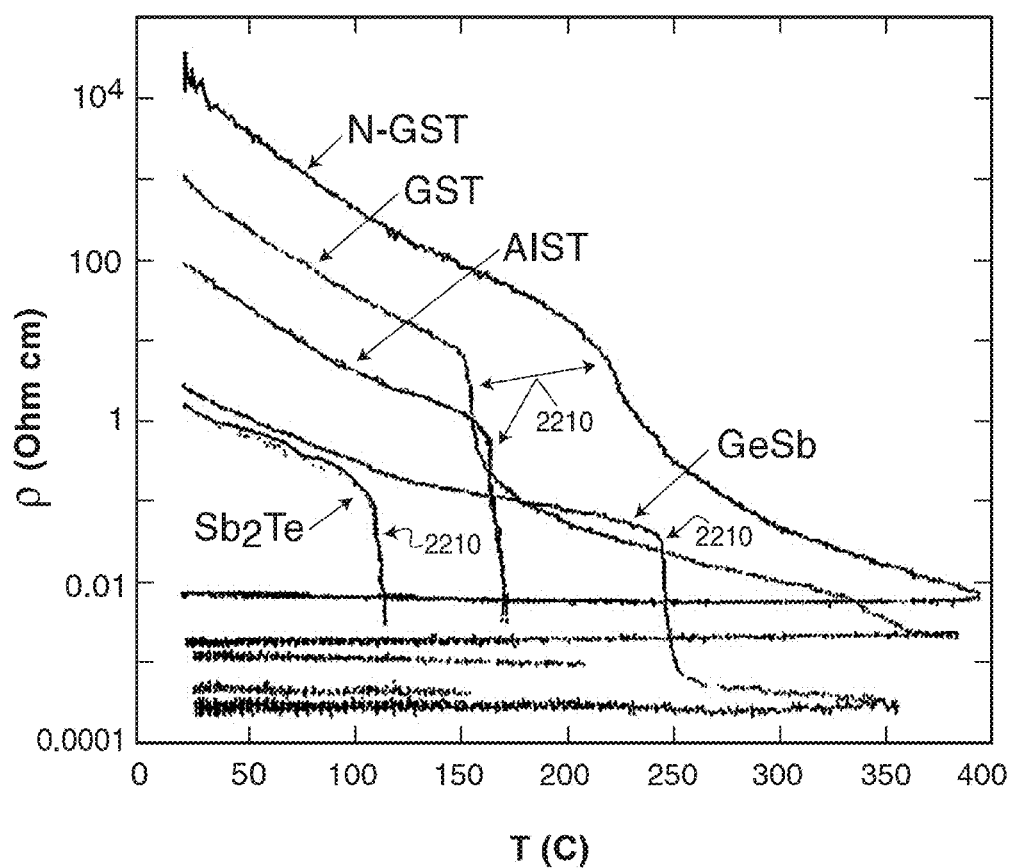
FIG. 2D shows an example of temperature versus resistance in a PCM material.
Figure 2E:
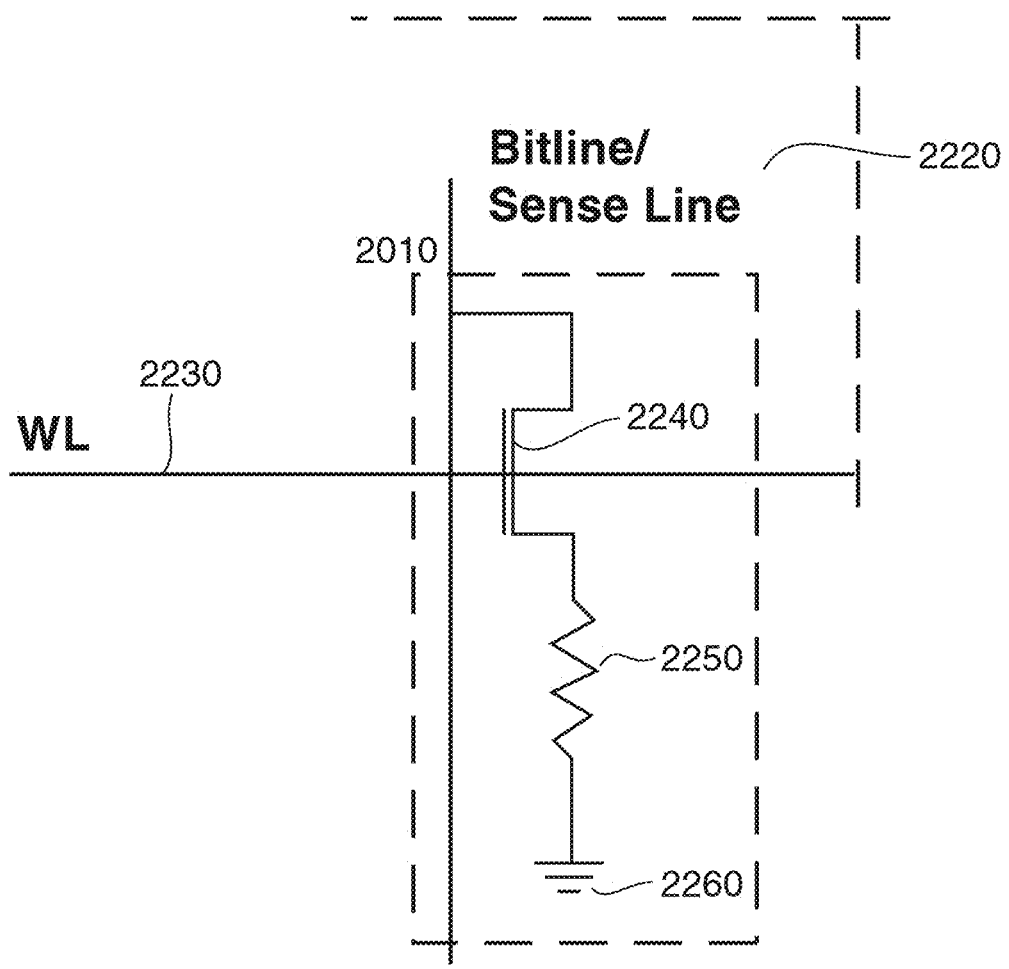
FIG. 2E shows an example of a PCM cell.
Figure 2F:
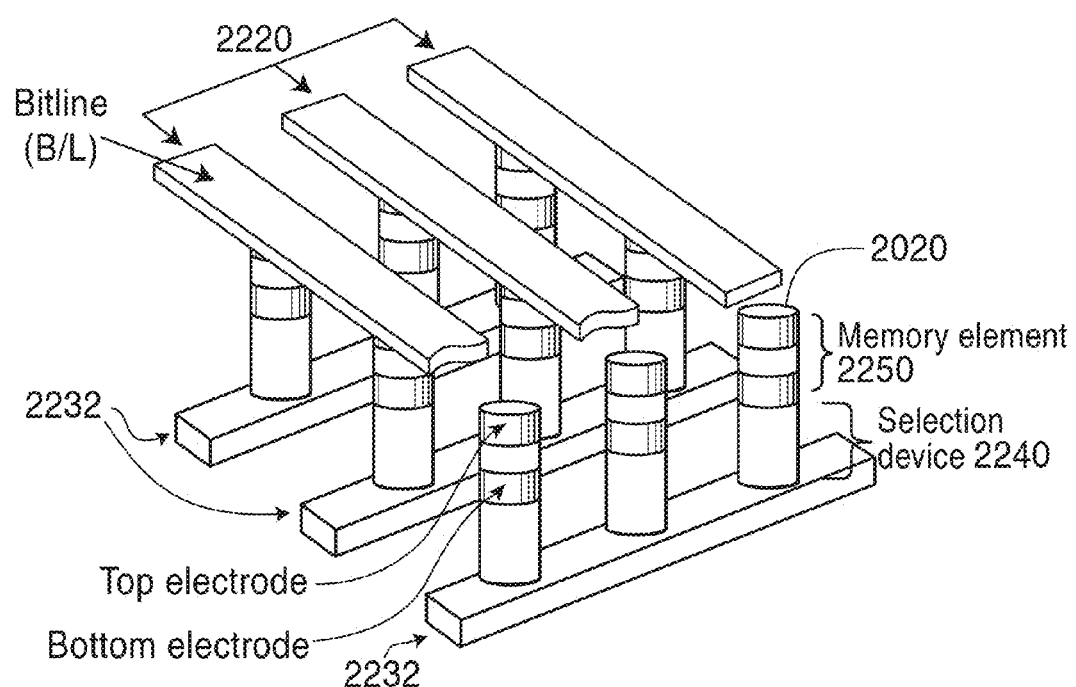
FIG. 2F shows an example of a PCM cell.
Figure 2G:
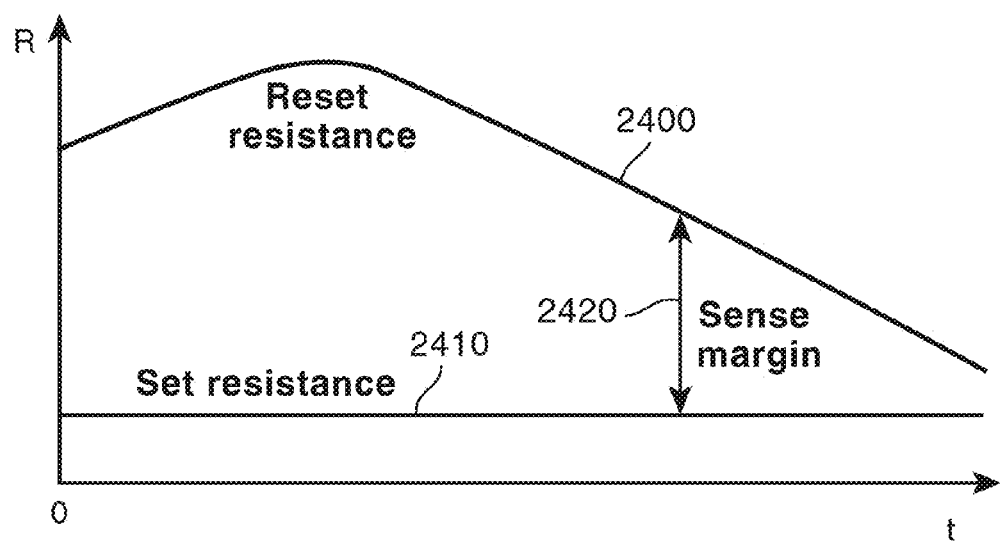
FIG. 2G shows an example of resistance over time for a PCM cell.
Figure 2H:
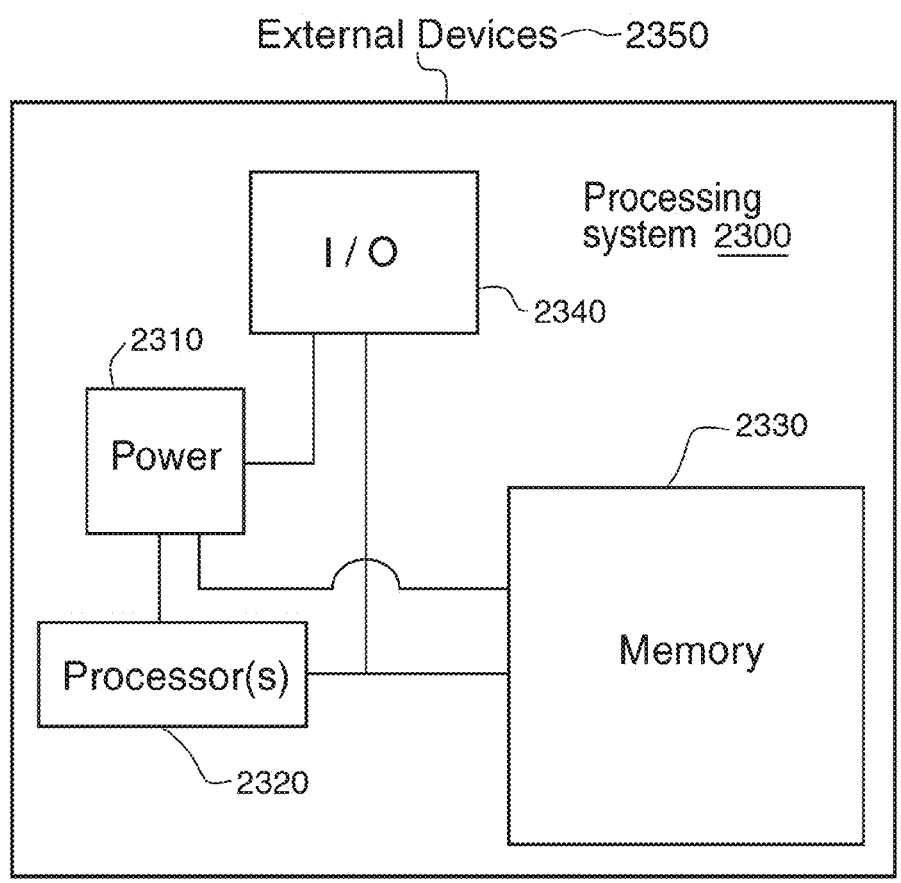
FIG. 2H shows an example of a processing system.
Figure 2I:
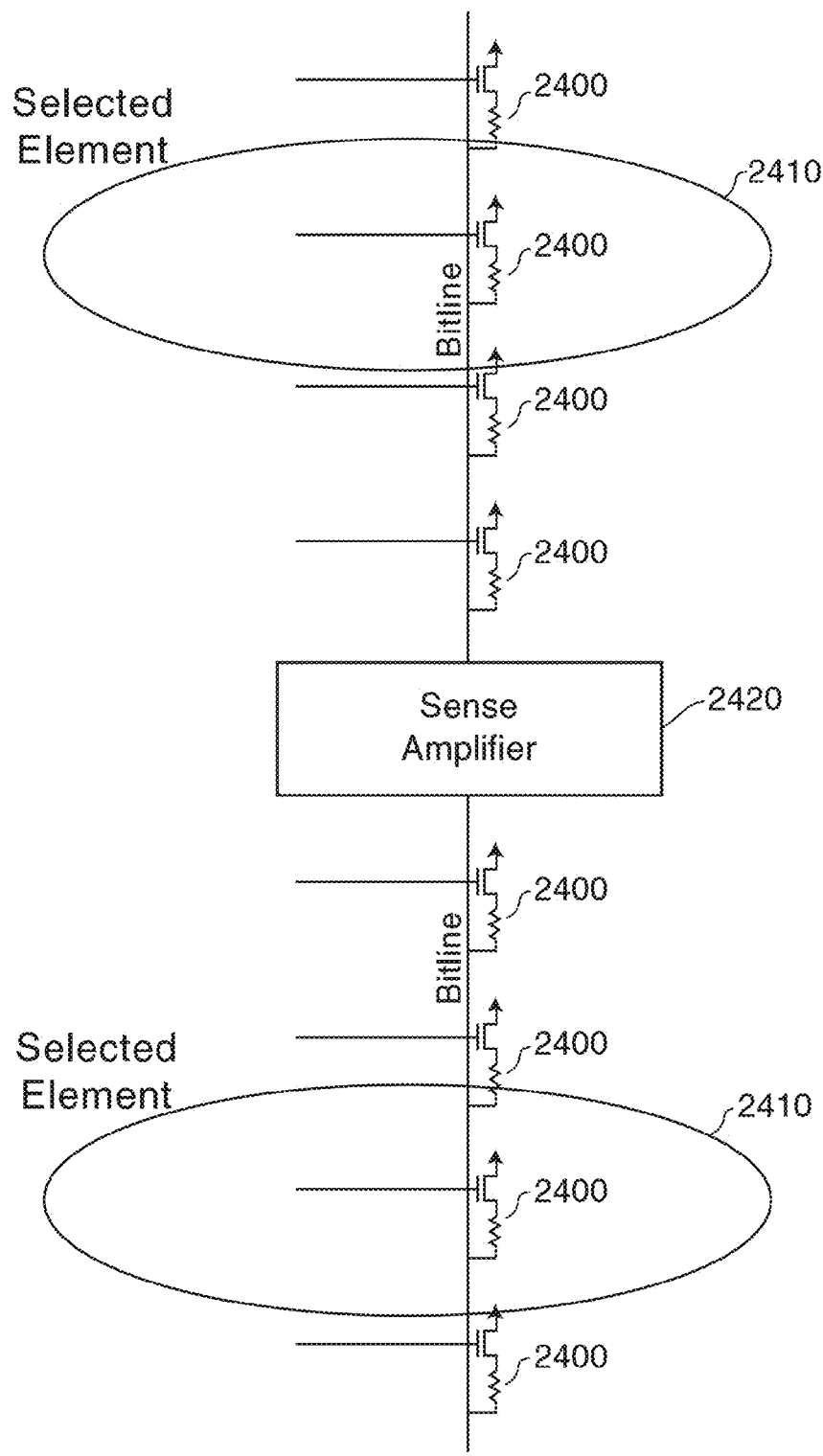
FIG. 2I shows an example of a PCM single ended sensing memory.
Figure 2J:
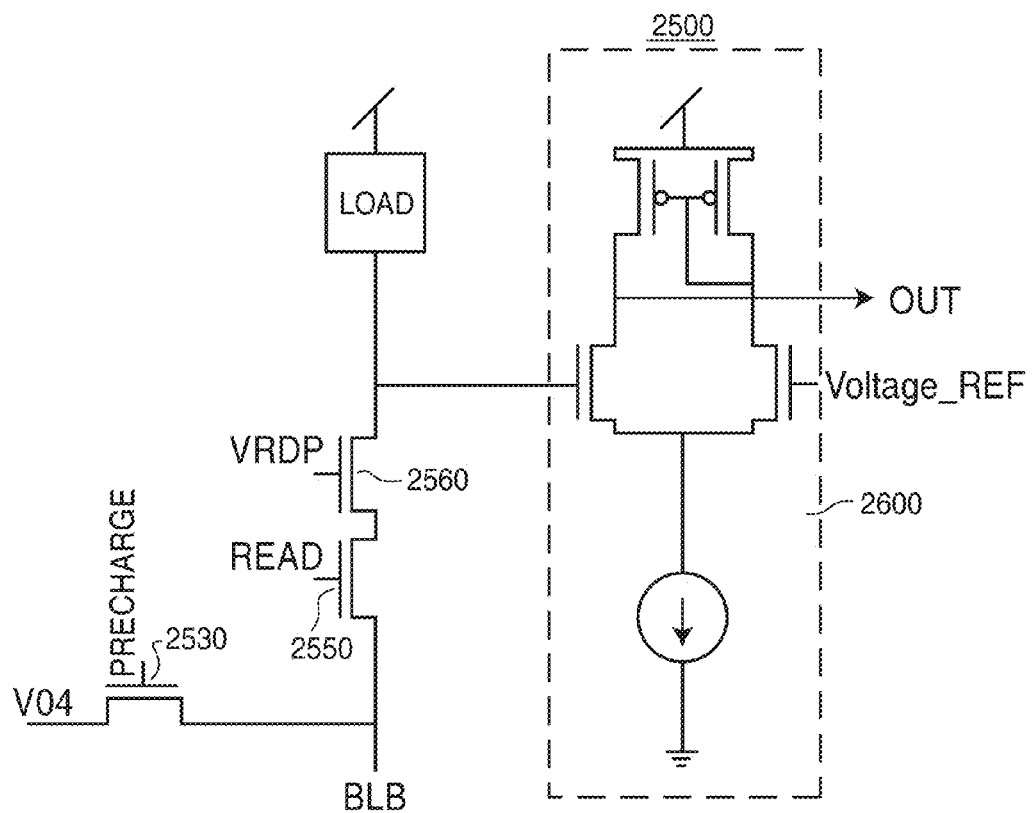
FIG. 2J shows an example of a known PCM single ended sense amplifier.

FIG. 1B shows one breakdown of the currents on the target bit line and the reference bit line in one sample embodiment of the present inventions. Target bit line current ($I_{BL-DATA}$) 102 is comprised of RC current ($I_{RC}(t_1)$) 106A, target data current ($I_{DATA}(V)$) 108, and leakage current ($-I_{LEAK}$) 110A. Similarly, reference bit line current ($I_{BL-REF}$) 104 is comprised of RC current ($I'_{RC}(t_2)$) 106B, reference current ($I_{REF}$) 112, and leakage current ($-I'_{LEAK}$) 110B. Leakage currents 110A and 110B are negative, as the leakage in question is leakage away from the bit line, decreasing the bit line current. As indicated by the dashed lines, RC currents 106A and 106B cancel each other when $t_1=t_2$, assuming precharge currents are appropriately matched in magnitude as well as in time. Leakage currents 110A and 110B also ideally cancel.

In some sample embodiments, the primary component of leakage current that can be cancelled by the use of a reference bit line is a statistical noise component. Leakage current (due at least in part to parasitic resistance) can be strongly dependent on e.g. time, temperature, and history of the cells. In some situations, then, the leakage currents on the target bit line and the reference bit line will not completely cancel. However, even when the statistical noise component is the only leakage current component to cancel, this current matching can still be very beneficial in some implementations.

By matching the charging current in time and in magnitude on both the target and the reference bit lines (e.g. by current mirroring), the condition of $t_1=t_2$ is met, and $I_{RC}(t_1)$ will cancel I'$_{RC}$(t$_2$). The comparison will then be effectively directly between target data current 108 and reference current 112.

Figure 3A:
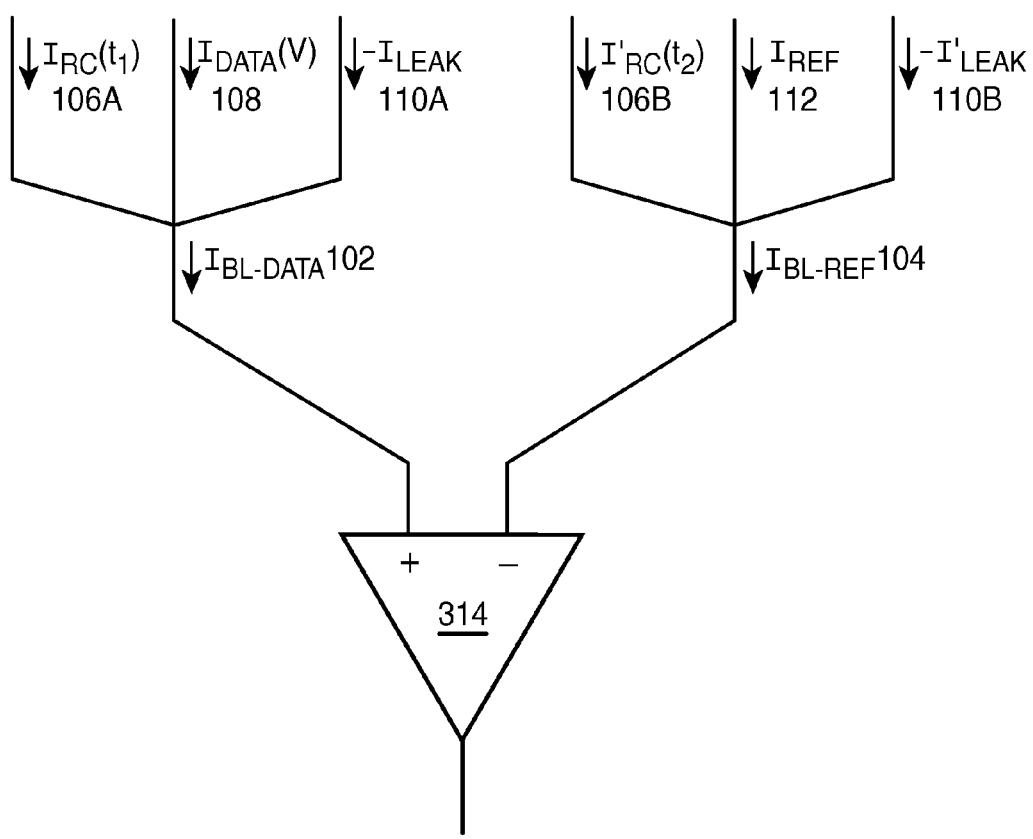
FIGS. 3A and 3B show current inputs into a sense amplifier for one sample embodiment.
Figure 3B:
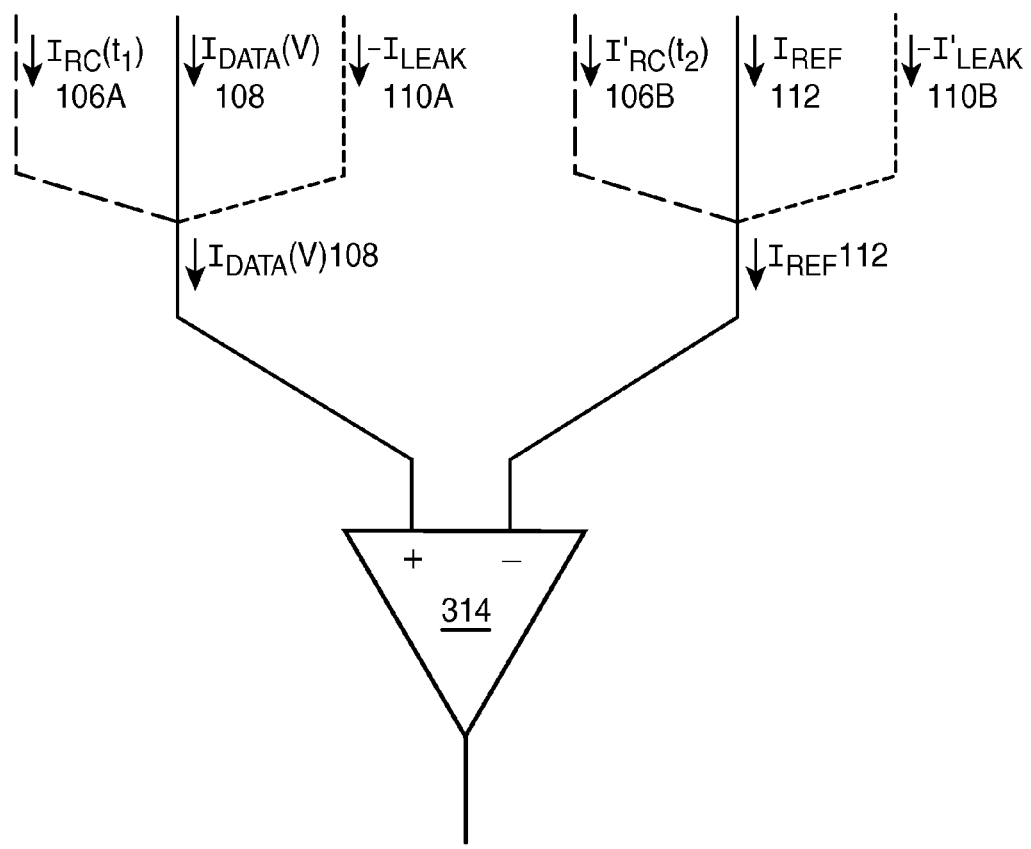

FIGS. 3A and 3B show current comparison and cancellation in a slightly different manner than does FIG. 1. In FIG. 3A, target bit line current I$_{BL-DATA}$ 102 is again comprised of RC current I$_{RC}$(t$_1$) 106A, data current I$_{DATA}$(V) 108, and leakage current −I$_{LEAK}$ 110A. Similarly, reference bit line current I$_{BL-REF}$ 104 is again comprised of RC current I'$_{RC}$(t$_2$) 106B, reference current I$_{REF}$ 112, and leakage current −I'$_{LEAK}$ 110B. Target bit line current I$_{BL-DATA}$ 102 and reference bit line current I$_{BL-REF}$ 104 are positive and negative inputs, respectively, into differential sense amplifier 314.

In FIG. 3B, when cancellation conditions are met, the matching current components (I$_{RC}$(t$_1$) 106A with I'$_{RC}$(t$_2$) 106B, and −I$_{LEAK}$ 110A with −I'$_{LEAK}$ 110B) cancel (as indicated by the dashed lines on the respective parallel current branches). These cancellation conditions are, e.g., time- and amplitude-matched precharge currents, e.g. such that I$_{RC}$(t$_1$)=I'$_{RC}$(t$_2$). This effectively leaves the net inputs to differential sense amplifier 314 to be I$_{DATA}$(V) 108 and I$_{REF}$ 112.

Figure 4:
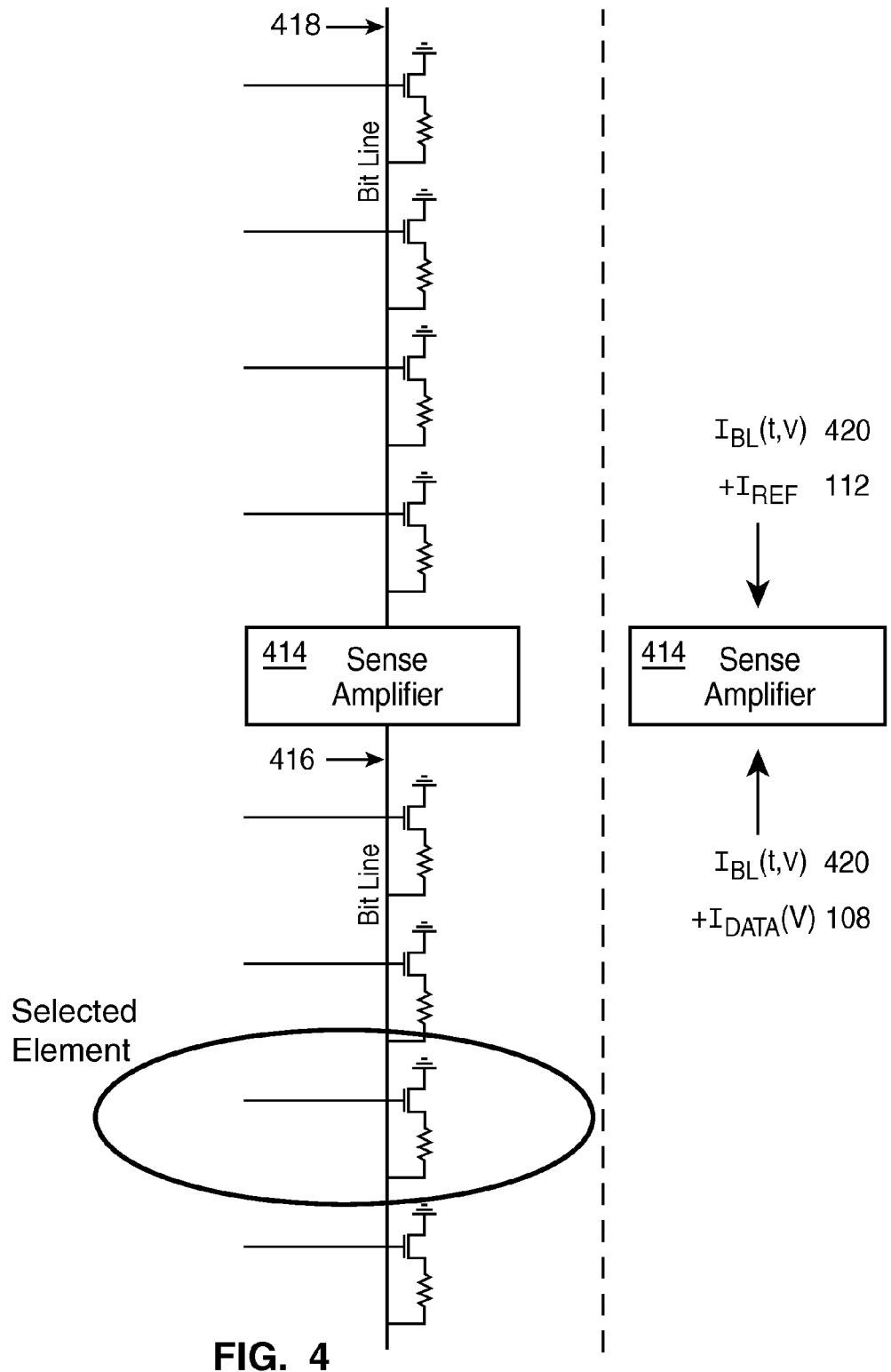
FIG. 4 schematically shows matched bit lines for one sample embodiment of the present inventions.

FIG. 4 shows a higher-level schematic of one sample embodiment, which shows both currents and bit lines. Target bit line 416 is input into sense amplifier 414 with bit line 418, which is acting as reference bit line in this sample embodiment. At right, it can be seen that the current on target bit line 416 comprises time- and voltage-dependent bit line current I$_{BL}$(t,V) 420 and target data current I$_{DATA}$(V) 108. The current on reference bit line 418 comprises time- and voltage-dependent bit line current I$_{BL}$(t,V) 420 and reference current I$_{REF}$ 112.

Figure 5:
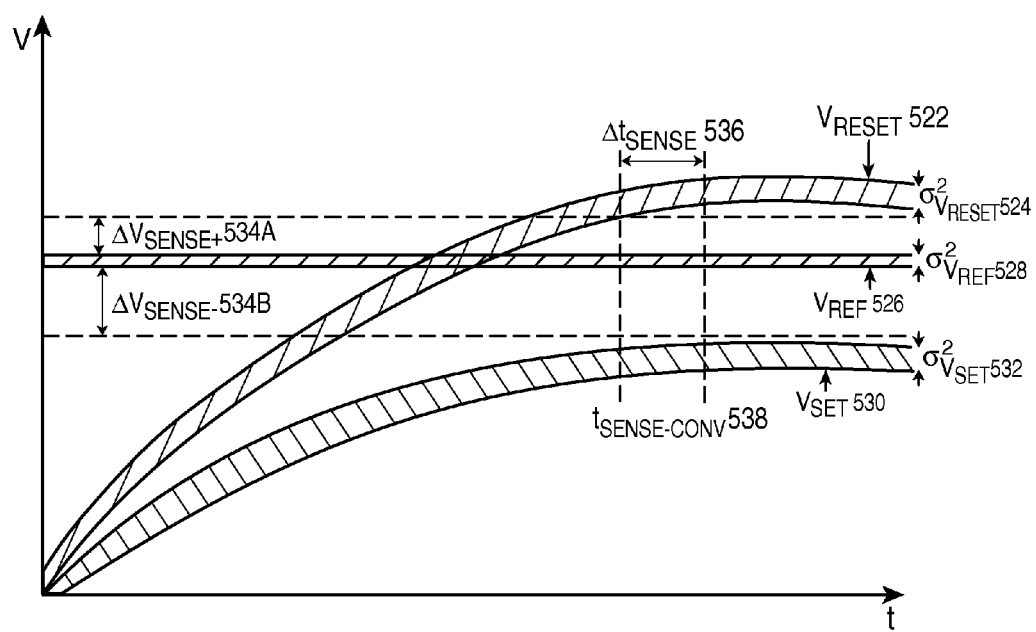
FIG. 5 shows a sample conventional plot of voltage vs. time.

FIG. 5 shows a voltage vs. time plot for one sample embodiment of a more conventional sense amplifier comparison. Each of the voltage curves has some width, which can be e.g. indicated by covariance σ$^2$, resulting from e.g. error, uncertainty, and standard deviation. In this example, the width σ$^2_{VRESET}$ 524 of curve V$_{RESET}$ 522 is roughly comparable to the width σ$^2_{VSET}$ 532 of curve V$_{SET}$ 530, and both curve widths 524 and 532 are larger than the width σ$^2_{VREF}$ 528 of reference voltage V$_{REF}$ 526. In order for the sense amplifier to reliably compare V$_{RESET}$ 522 and V$_{SET}$ 530 to reference voltage V$_{REF}$ 526, the entire widths σ$^2_{VRESET}$ 524 and σ$^2_{VSET}$ 532 of V$_{RESET}$ 522 and V$_{SET}$ 530 respectively must be outside the sense margins ΔV$_{SENSE+}$ 534A and ΔV$_{SENSE-}$ 534B, which are centered around V$_{REF}$ 526, for at least a sensing time Δt$_{SENSE}$ 536. Sensing cannot conventionally occur before V$_{RESET}$ 522 and V$_{SET}$ 530 settle outside the sense margins at t$_{SENSE-CONV}$ 538.

Figure 6:
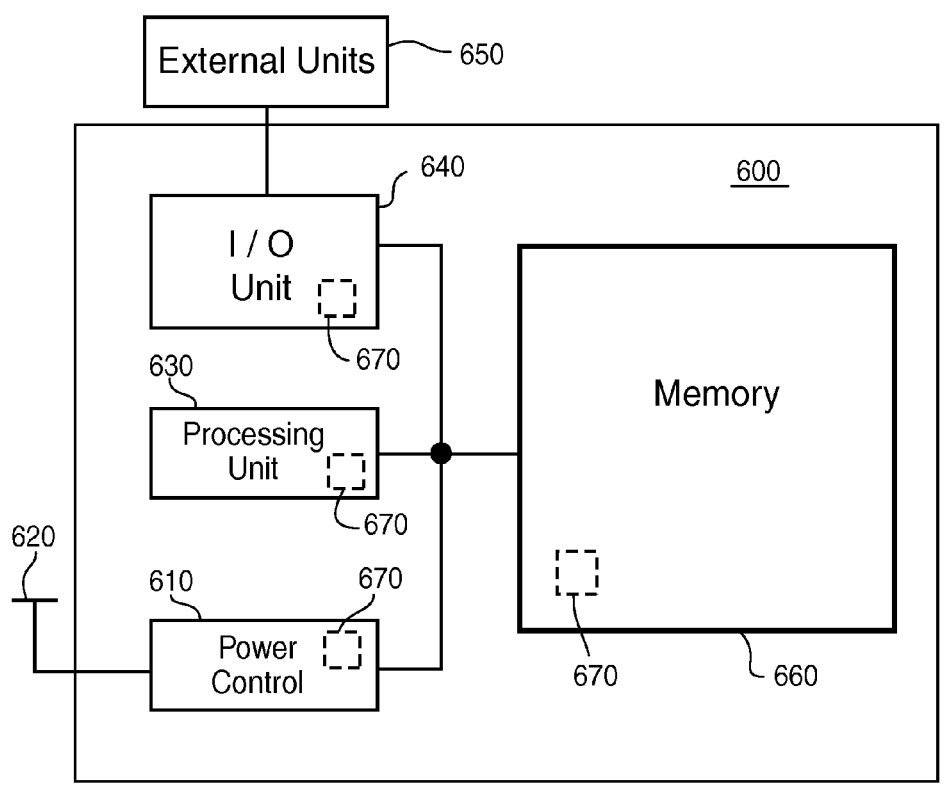
FIG. 6 shows a sample phase change memory system.

FIG. 6 shows an example of a processing system 600. Power control 610 manages distribution of power from a power source 620 to other components of the processing system. A processing unit 630 performs processing functions, and an I/O 640 (input/output) unit operates and manages communications with, and enables other processing system components 610, 630, 640, 660 to operate and manage communications with, external units 650. The power control 610, processing unit 630 and I/O unit 640 can also make memory access calls to a memory 660. Processing system components 610, 630, 640, 660 perform their functions based on configuration data stored by non-volatile PCM memory 670 which can be integrated into respective processing system components 610, 630, 640, 660.

Configuration data can be loaded into non-volatile memory for runtime accesses. Configuration data can be used to tune PCRAM and other components (e.g., power control 610, processing unit 630 or I/O unit 640) behavior in a design, test, or as-manufactured context. Configuration data can comprise, for example, information used by processing system components to operate external units 650; redundancy information, used to redirect accesses (read and write requests) from defective or otherwise inoperative memory cells to redundant (backup) memory cells; trim information, generally used to alter the state of an existing topology when device features as-manufactured show variation—which can be expected within some degree of statistical distribution—that can be corrected using measures built into the device; test information used to implement test functions, e.g., for device design, design testing or as-manufactured quality assurance purposes; or to change timing (e.g., sense amp timing, or setup and hold timing in a data path), internal supply voltages, whether ECC (error correction) or other memory or other component functionality is activated, or other component operation parameters (such as word length, instruction set, or whether to use single-ended or multi-differential multi-bit sensing in a particular context).

Figure 7A:
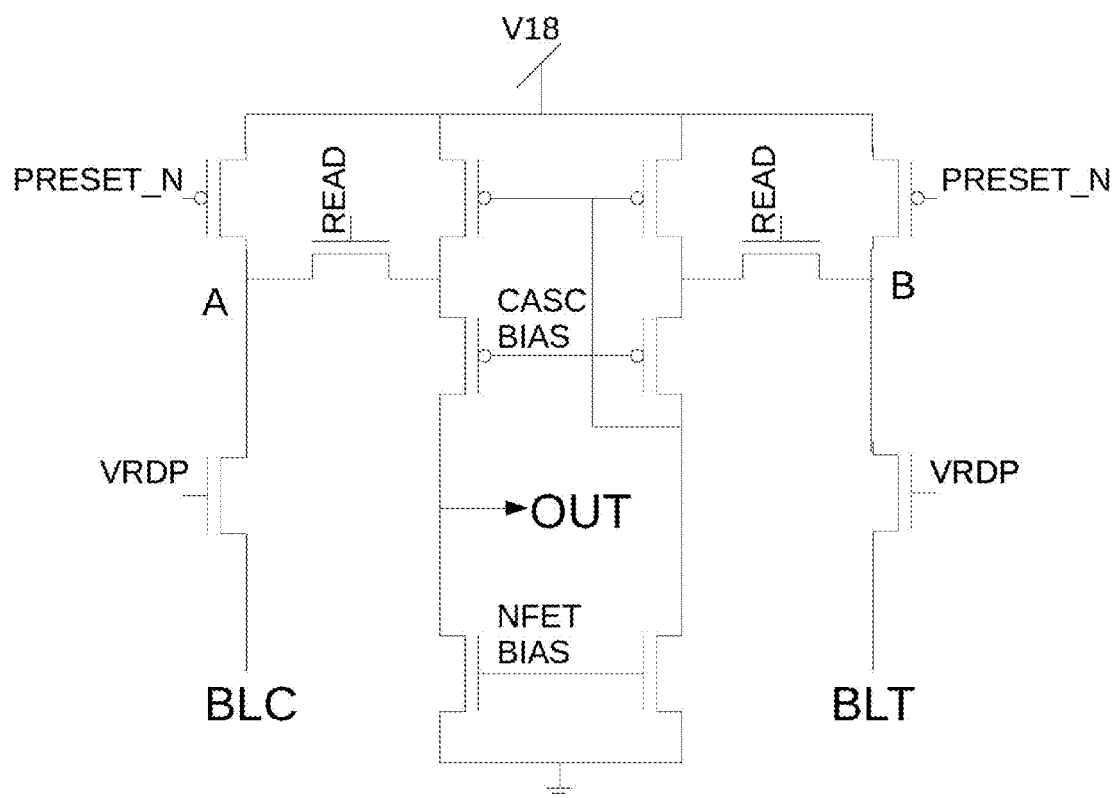
FIGS. 7A, 7B, and 7C show sample sense amplifier circuits and timing diagrams.
Figure 7B:
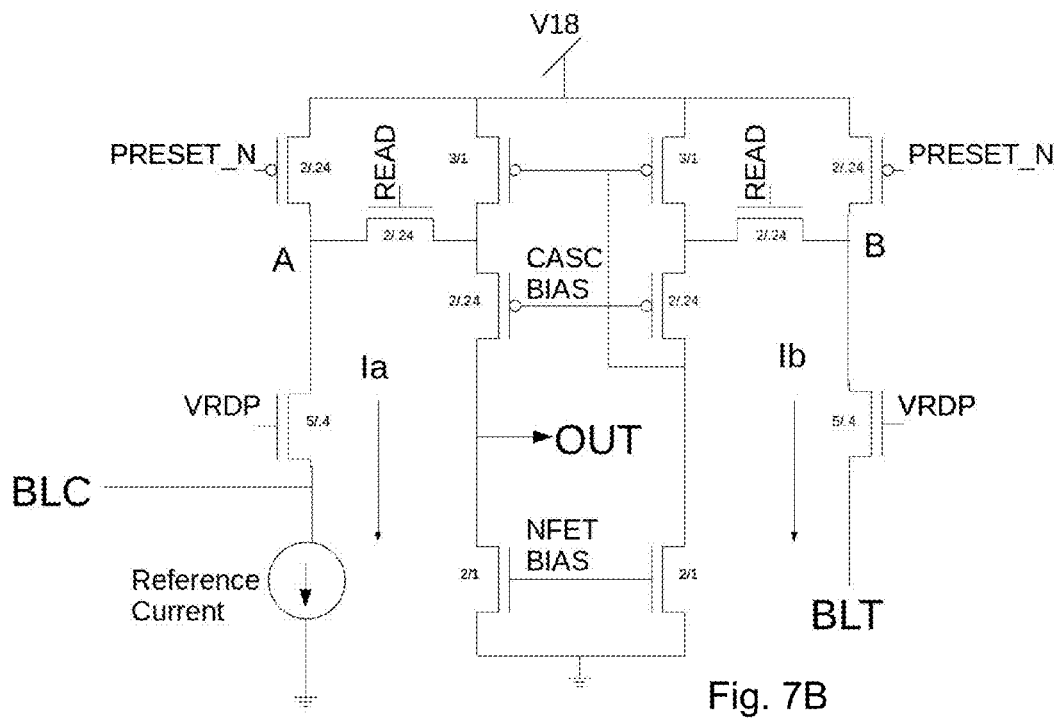

FIGS. 7A and 7B show differential sense amplifier circuitry for two sample embodiments. In one sample embodiment, BLT can be connected to a data bit line and BLC can be connected to a reference bit line.

In another sample embodiment, two fully different cells can be connected to BLT and BLC.

In one sample embodiment, devices can have a minimum length of 240 nm in a 90 nm technology, and critical matching devices can have channel lengths on the order of one micron. The sense amp as a whole can be, for example, approximately 25 um×30 um.

Figure 7C:
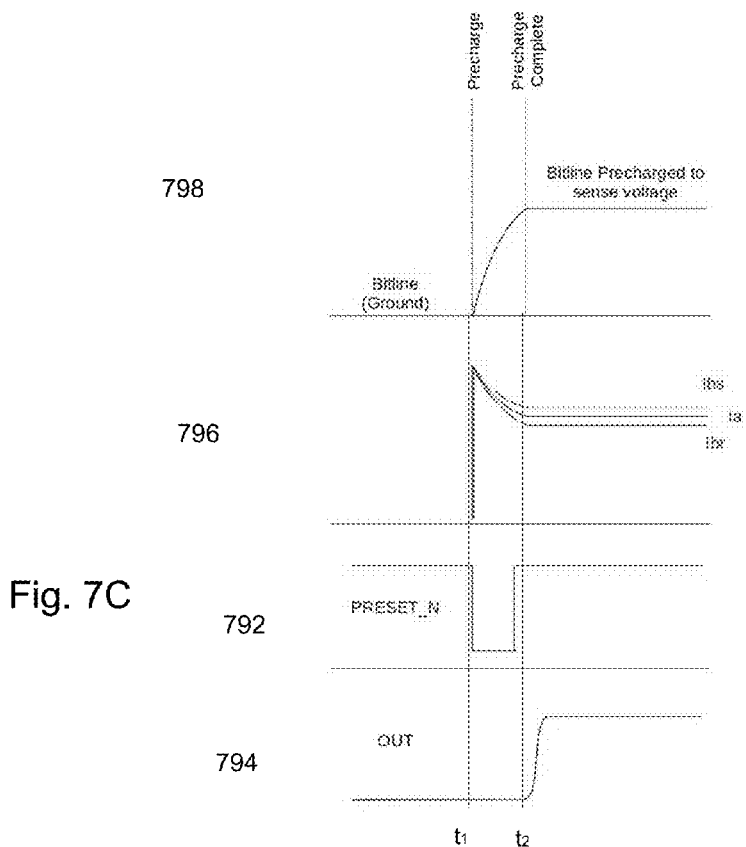

FIG. 7C shows a sample timing diagram for, e.g., the sense amplifier of FIG. 7B. In one sample embodiment, the selected cell on bit line BLT is in a low-impedance SET state. At time t$_1$, PRESET_N (in FIG. 7B) goes active low, as seen in plot 792. At this time, the bit line voltage begins to rise in voltage plot 798. In current plot 796, currents Ia (corresponding, e.g., to the reference voltage), Ibs (e.g. a SET signal), and Ibr (e.g. a RESET signal) spike and then begin to settle. At time t$_2$, PRESET_N goes inactive high in plot 792 and READ (in FIG. 7B) goes active high, as seen by plot 794 of signal OUT. Bit line voltage in plot 798, and bit line currents in plot 796, are completely precharged, and settle at (substantially) constant values.

According to some but not necessarily all embodiments, there is provided: Methods, circuits, and systems for phase change memories. A matching bit line, on which no data-containing PCM cells have been selected, is used to cancel out time-dependent current components due to parasitic capacitive and leakage resistance loading of bit lines. This can effectively allow direct comparison of the current from the phase change memory cell to the desired reference current, at a time before the voltage of the first bit line permits stable operations using DC comparison.

According to some but not necessarily all embodiments, there is provided: A system, comprising: a phase-change memory unit, a processor which executes programmable instruction sequences, and an input/output unit; wherein, during read operations, said processor directs current supply circuitry to apply matched charging currents to both a first bit line which has been selected, and also to a second bit line which has not been selected; wherein said processor directs a differential stage to sense the state of said first bit line by reference to at least the state of said second bit line, to thereby sense data stored in a phase-change memory cell which is located on said first bit line and which has been addressed by a selected word line; wherein said processor transmits the output of said differential comparison stage to said input/output unit, to thereby ultimately produce a data output;

wherein said current supply circuitry supplies matched charging currents while said differential stage senses the state of said first bit line; whereby said differential stage compensates both for parasitic capacitance, and also parasitic leakage resistance, of said first and second bit lines; wherein said differential stage senses the state of said first bit line at a time before the voltage of said first bit line permits stable read operations using DC comparison.

According to some but not necessarily all embodiments, there is provided: A phase change memory device, comprising: charge supply circuitry which, when charging current is to be supplied to a first bit line in order to sense the state of a PCM element on said first bit line, simultaneously supplies equal charging currents both to said first bit line and also to a reference bit line; a differential stage which provides current from said first bit line to a sense input of a sense amplifier, and simultaneously provides current from said reference bit line to a reference input of said sense amplifier; wherein the output of said sense amplifier is substantially equivalent to a directly comparison of the current from said PCM element to a reference current, and is substantially independent of parasitic leakage in said bit lines, and is also substantially independent of parasitic capacitance in said bit lines; wherein said differential stage provides the currents at a time before the voltage of said first bit line permits stable read operations using DC comparison.

According to some but not necessarily all embodiments, there is provided: A phase change memory device, comprising: current supply circuitry which, during read operations, applies equal charging currents to both a first bit line which has been selected, and also to a second bit line which has not been selected; a differential stage which senses the state of said first bit line by reference to at least the state of said second bit line, to thereby sense data stored in a phase-change memory cell which is located on said first bit line and which has been addressed by a selected word line; and output circuitry which transmits the output of said differential comparison stage to thereby ultimately produce a data output; wherein said current supply circuitry supplies equal charging currents while said differential stage senses the state of said first bit line; whereby said differential stage compensates both for parasitic capacitance, and also parasitic leakage resistance, of said first and second bit lines; wherein said differential stage senses the state of said first bit line at a time before the voltage of said first bit line permits stable read operations using DC comparison.

According to some but not necessarily all embodiments, there is provided: A phase change memory device, comprising: read circuitry which, during read operations, decodes a read address to thereby identify selected bit line and word line addresses; charge circuitry which, during read operations, applies matched charging currents to both a first bit line corresponding to said selected bit line address, and also to a second bit line; wherein said first and second bit lines are each connected to multiple phase-change memory cells which can store data, and which have matched capacitances; a differential stage which senses the state of said first bit line by reference to at least the state of said second bit line, while said charge circuitry is still providing matched and changing charging currents to said first and second bit lines, while a word line is activated which intersects said first bit line at a memory cell location corresponding to said read address, to thereby sense data stored in a phase-change memory cell which is located on said first bit line at said memory cell location, at a time before the voltage of said first bit line permits stable read operations using DC comparison; whereby said differential stage compensates both for parasitic capacitance, and also parasitic leakage resistance, of said first and second bit lines.

According to some but not necessarily all embodiments, there is provided: A method of operating a phase change memory, comprising: when charging current is to be supplied to a first bit line in order to sense the state of a PCM element on said first bit line, simultaneously supplying equal charging currents both to said first bit line and also to a reference bit line; providing current from said first bit line to a sense input of a sense amplifier, and simultaneously providing current from said reference bit line to a reference input of said sense amplifier; wherein the output of said sense amplifier is substantially equivalent to directly comparing the current from said PCM element to a reference current, and is substantially independent of parasitic leakage in said bit lines, and is also substantially independent of parasitic capacitance in said bit lines; wherein said steps of providing current to a sense amplifier occur at a time before the voltage of said first bit line permits stable read operations using DC comparison.

According to some but not necessarily all embodiments, there is provided: A method of reading a phase change memory, comprising: applying equal charging currents to both a first bit line which has been selected, and also to a second bit line which has not been selected, and differentially sensing the state of said first bit line by reference to at least the state of said second bit line, to thereby sense data stored in a phase-change memory cell which is located on said first bit line and which has been addressed by a selected word line; and transmitting the output of said differential comparison stage to thereby ultimately produce a data output; wherein said step of applying equal charging currents is still ongoing while said step of differentially sensing is being performed; whereby said step of differentially sensing compensates both for parasitic capacitance, and also parasitic leakage resistance, of said first and second bit lines; wherein said step of differentially sensing occurs at a time before the voltage of said first bit line permits stable read operations using DC comparison.

According to some but not necessarily all embodiments, there is provided: A method of reading a phase change memory, comprising: decoding a read address to thereby identify selected bit line and word line addresses; applying matched charging currents to both a first bit line corresponding to said selected bit line address, and also to a second bit line; wherein said first and second bit lines are each connected to multiple phase-change memory cells which can store data, and which have substantially matched capacitances; differentially sensing the state of said first bit line by reference to at least the state of said second bit line, while still providing matched charging currents to said first and second bit lines, while activating a word line which intersects said first bit line at a memory cell location corresponding to said read address, to thereby sense data stored in a phase-change memory cell which is located on said first bit line at said memory cell location, at a time before the voltage of said first bit line permits stable read operations using DC comparison; whereby said step of differentially sensing compensates both for parasitic capacitance, and also parasitic leakage resistance, of said first and second bit lines.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some sample embodiments, current from a selected cell is compared to a reference current. In other sample embodiments, voltage across a selected cell is compared to a reference voltage.

In one contemplated embodiment, parasitic inductances can also be matched using a reference bit line.

In some sample embodiments, reference current $I_{REF}$ can be e.g. from a reference current input. In other sample embodiments, reference current $I_{REF}$ can be e.g. from a dummy row having reference loading. In still other sample embodiments, reference current $I_{REF}$ can be a current bias in the sense amplifier. Other sources for reference current $I_{REF}$ are also contemplated.

In some sample embodiments, one or more "dummy" bit lines are designated as reference bit lines and are reserved exclusively for said purpose. In some sample embodiments, one or more dedicated reference bit lines can be designated in each subarray. In other sample embodiments, some or all of the bit lines in a single subarray can be designated as dedicated reference bit lines for some or all of the array.

In most presently-preferred embodiments, each memory subarray has a "twin" subarray. In one contemplated embodiment, a reference bit line is chosen by selecting from the twin subarray the bit line which corresponds to the target bit line. However, this can lead to problems if the corresponding bit line is corrupted or broken.

In some sample embodiments, a dedicated reference bit line can be rewritten periodically as appropriate to ensure its continued suitability as a reference bit line.

In some sample embodiments, a separate reference bit line is accessed for each group of N bit lines.

In some sample embodiments, leakage current can depend strongly on temperature, so that some attention can be needed to prevent drastic temperature mismatch.

In one sample embodiment, instead of the leakage currents from the two bit lines effectively directly cancelling in the sense amplifier, a time average of the leakage current from one of the bit lines is subtracted from the reference current.

In some sample embodiments, instead of having equal charging currents on the target bit line and on the reference bit line, the charging currents can instead be e.g. proportional charging currents. This can be particularly applicable if e.g. the reference bit line and the target bit line have different numbers of cells.

Additional general background, which helps to show variations and implementations, as well as some features which can be implemented synergistically with the inventions claimed below, may be found in the following US patent applications. All of these applications have at least some common ownership, copendency, and inventorship with the present application, and all of them are hereby incorporated by reference: U.S. Provisional Pat. Nos. 61/694,217; 61/694, 220; 61/694,221; 61/694,223; 61/694,224; 61/694,225; 61/694,228; 61/694,234; 61/694,240; 61/694,242; 61/694, 243; 61/694,245; 61/698,532; 61/698,539; 61/698,544; 61/699,184; 61/784,208; 61/784,298; 61/784,341; 61/784, 392; 61/784,445; 61/784,480; 61/784,523; 61/784,550; 61/784,579; 61/784,602; 61/813,236; 61/814,413; 61/814, 414; 61/814,415; 61/814,417; 61/814,419; 61/814,422; 61/814,424; 61/814,425; 61/815,164; 61/815,947; 61/816, 045; 61/816,825; 61/820,385; 61/826,231; 61/828,361; 61/829,579; 61/831,314; U.S. application Ser. Nos. 13/869, 065; 13/869,074; 13/869,082; 13/869,088; 13/869,108; 13/869,134; 13/869,231; 13/869,243; 13/869,338; 13/869, 377; 13/869,486; 13/869,519; 13/869,632; 13/869,679; 13/869,735; 13/869,752; 13/869,827; and 13/869,843.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, may be found in the following publications, all of which are hereby incorporated by reference: Lam, Chung. "Phase Change Memory: A Replacement or Transformational Memory Technology," IEEE Workshop on Microelectronics and Electron Devices (WMED), c. 2011. Choi, Youngdon, et al. "A 20 nm 1.8V 8 Gb PRAM with 40 MB/s Program Bandwidth." ISSCC 2012/Session 2/High Bandwidth DRAM & PRAM/2.5. c. 2012.

The claims as filed are intended to be as comprehensive as possible, and NO subject matter is intentionally relinquished, dedicated, or abandoned.

What is claimed is:

1. A method of reading a phase change memory, comprising:
   decoding a read address to thereby identify selected bit line and word line addresses;
   applying matched charging currents to both a first bit line corresponding to said selected bit line address, and also to a second bit line; wherein said first and second bit lines are each connected to multiple phase-change memory cells which can store data, and which have substantially matched capacitances;
   differentially sensing the state of said first bit line
      by reference to at least the state of said second bit line,
      while still providing matched charging currents to said first and second bit lines,
      while activating a word line which intersects said first bit line at a memory cell location corresponding to said read address, to thereby sense data stored in a phase-change memory cell which is located on said first bit line at said memory cell location,
      at a time before the voltage of said first bit line permits stable read operations using DC comparison;
   whereby said step of differentially sensing compensates both for parasitic capacitance, and also parasitic leakage resistance, of said first and second bit lines.

2. The method of reading a phase change memory of claim 1, further comprising discharging said second bit line before said step of applying matched charging currents.

3. The method of reading a phase change memory of claim 1, wherein said matched charging currents are from matched current sources.

4. The method of reading a phase change memory of claim 1, wherein said matched charging currents are provided by current mirroring.

5. The method of reading a phase change memory of claim 1, wherein, during said step of differentially sensing, no word line which corresponds to any memory cell location on said second bit line is activated.

6. The method of reading a phase change memory of claim 1, whereby said step of differentially sensing compensates for parasitic inductance of said first and second bit lines.

7. The method of reading a phase change memory of claim 1, wherein said second bit line is a dedicated reference bit line.

8. The method of reading a phase change memory of claim 1, wherein a reference cell on a dedicated reference row of said second bit line is selected, but no independently addressable word line on said second bit line has been accessed.

9. A method of reading a phase change memory, comprising:
applying equal charging currents to both a first bit line which has been selected, and also to a second bit line which has not been selected, and differentially sensing the state of said first bit line by reference to at least the state of said second bit line, to thereby sense data stored in a phase-change memory cell which is located on said first bit line and which has been addressed by a selected word line; and
transmitting the output of said differential comparison stage to thereby ultimately produce a data output;
wherein said step of applying equal charging currents is still ongoing while said step of differentially sensing is being performed;
whereby said step of differentially sensing compensates both for parasitic capacitance, and also parasitic leakage resistance, of said first and second bit lines;
wherein said step of differentially sensing occurs at a time before the voltage of said first bit line permits stable read operations using DC comparison.

10. The method of reading a phase change memory of claim 9, wherein said matched charging currents are from matched current sources.

11. The method of reading a phase change memory of claim 9, wherein said matched charging currents are provided by current mirroring.

12. The method of reading a phase change memory of claim 9, wherein, during said step of differentially sensing, no word line which corresponds to any memory cell location on said second bit line is activated.

13. The method of reading a phase change memory of claim 9, further comprising discharging said second bit line before said step of applying equal charging currents.

14. The method of reading a phase change memory of claim 9, whereby said step of differentially sensing compensates for parasitic inductance of said first and second bit lines.

15. The method of reading a phase change memory of claim 9, wherein said second bit line is a dedicated reference bit line.

16. The method of reading a phase change memory of claim 9, wherein a reference cell on a dedicated reference row of said second bit line is selected, but no independently addressable word line on said second bit line has been accessed.

17. A method of operating a phase change memory, comprising:
when charging current is to be supplied to a first bit line in order to sense the state of a PCM element on said first bit line, simultaneously supplying equal charging currents both to said first bit line and also to a reference bit line;
providing current from said first bit line to a sense input of a sense amplifier, and simultaneously providing current from said reference bit line to a reference input of said sense amplifier;
wherein the output of said sense amplifier is substantially equivalent to directly comparing the current from said PCM element to a reference current, and is substantially independent of parasitic leakage in said bit lines, and is also substantially independent of parasitic capacitance in said bit lines;
wherein said steps of providing current to a sense amplifier occur at a time before the voltage of said first bit line permits stable read operations using DC comparison.

18. The method of operating a phase change memory of claim 17, wherein said equal charging currents are from matched current sources.

19. The method of operating a phase change memory of claim 17, wherein said equal charging currents are provided by current mirroring.

20. The method of operating a phase change memory of claim 17, further comprising discharging said reference bit line before said step of simultaneously supplying equal charging currents.

* * * * *